US007230453B2

(12) United States Patent
Dubey

(10) Patent No.: US 7,230,453 B2
(45) Date of Patent: Jun. 12, 2007

(54) OUTPUT BUFFER PROVIDING MULTIPLE VOLTAGES

(75) Inventor: Hari Bilash Dubey, DT-Ghazipur (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 99 days.

(21) Appl. No.: 11/022,574

(22) Filed: Dec. 22, 2004

(65) Prior Publication Data

US 2005/0194994 A1 Sep. 8, 2005

(30) Foreign Application Priority Data

Dec. 29, 2003 (IN) .................. 1631/DEL/2003

(51) Int. Cl.
*H03K 19/0175* (2006.01)

(52) U.S. Cl. .................. 326/88; 326/83; 326/81

(58) Field of Classification Search ............. 326/81–90
See application file for complete search history.

(56) References Cited

U.S. PATENT DOCUMENTS

| 5,159,215 | A | * | 10/1992 | Murotani | 326/106 |
|---|---|---|---|---|---|
| RE34,797 | E | * | 11/1994 | Sato et al. | 365/189.09 |
| 5,742,196 | A | * | 4/1998 | Fronen et al. | 327/382 |
| 6,670,858 | B2 | * | 12/2003 | Tang | 331/57 |
| 6,696,880 | B2 | * | 2/2004 | Pan et al. | 327/390 |

* cited by examiner

*Primary Examiner*—Don Le
(74) *Attorney, Agent, or Firm*—Lisa K. Jorgenson; James H. Morris; Wolf, Greenfield & Sacks, P.C.

(57) ABSTRACT

The present invention provides an output buffer providing multiple voltages including an arrangement of bootstrapping capacitors, and a charge replenishing mechanism which provides continuous pulses to the arrangement of bootstrapping capacitors, thereby, maintaining voltage on the bootstrapping capacitors.

16 Claims, 4 Drawing Sheets

FIG 1: Prior Art

OUTPUT BUFFER PROVIDING MULTIPLE VOLTAGES

BACKGROUND OF THE INVENTION

1. Field of the Invention

The present invention relates to an output buffer providing multiple voltages at an I/O interface. More specifically, the present invention relates to an output buffer for driving an I/O pad at the desired high voltage level along with providing circuitry for tolerating higher voltages.

2. Discussion of the Related Art

Implementation of integrated circuits using lower dimension feature sizes entails the need of scaling the supply voltages to a lower value. In certain applications, interfacing of circuits operating at different voltages is required. The output buffer of an I/O circuit uses a totem pole output for driving the pad. In a totem pole structure, the source of a P-channel device is connected to the supply voltage. Similarly, the source of an N-channel device is connected to the ground with the drain of both transistors connected together. Whenever a device operating at a lower voltage is connected to a node, which is also driven by some other logic operating at a higher voltage, the common node attains the higher voltage level. As a result, the diode formed by the drain of the P-channel transistor and the N-well in which the said P-channel device is formed, becomes forward biased. The P-channel transistor may also turn on. If any of these things happen, the circuit starts dissipating power and the common node clamps at the lower operating voltage.

Several approaches to solve this problem have been tried. One among them was to use an N-channel device instead of a P-channel device in the totem pole and the gate of the N-channel device was driven at a higher voltage level using a level translator to have full-swing voltage at the pad.

U.S. Pat. 5,952,847 is described with the help of FIG. 1. It illustrates a prior art output buffer. The output buffer circuit includes an output totem pole, a level shifter and logic enable block. The gate of the N-channel device in totem pole 12 used to drive the pad at 3.3V is kept at 5V through a level shifter. The oxide of the N-channel device of the totem pole 12, N-channel and P-channel devices of the level shifter 10 are rated for 5V. These transistors are having LDD structure to prevent short channel effect. The structure will prevent any power dissipation when the common node 14 is driven at 5V by any other logic. The output totem pole gets input from logic enable block 8, which is operating at 3.3V. However, the disadvantage of this circuit is that it needs two power supplies to achieve the goal.

SUMMARY OF THE INVENTION

In the present invention, the results are achieved using a single power supply and the gate of the said N-channel device is maintained at the desired higher voltage level through sustained bootstrapping. Bootstrapping utilizes a capacitance called Miller capacitance to raise the potential of the gate of a MOS device which is greater than the source potential applied to the terminals of the device in order to compensate for the threshold voltage drop while passing logic high at the pad.

To overcome at least some of the above limitations, the present invention provides a method for driving an I/O pad at the desired high voltage level along with providing circuitry for tolerating higher voltages.

An object of the present invention is to provide a circuit that can help interface devices operating at different voltages.

Another object of the present invention is to provide a totem pole output having a pull-up stage that will not turn on or whose junction diode will not turn on when the output is driven to a voltage higher than the operating voltage of the circuit of interest.

Another object of the present invention is to provide an output buffer that is resistant to latch-up.

Another object of the present invention is to provide a high voltage tolerant output buffer.

Another object of the present invention is to provide an output buffer operating at a single supply voltage along with having a capability of being connected to a common node which may be driven to a higher voltage without current sinking.

Another object of the present invention is to provide an I/O buffer that achieves rail-to-rail swing at the output through bootstrapping.

Another object of the present invention is to sustain the bootstrap by converting DC energy to AC energy through an oscillating means.

To achieve these and other objects, the present invention provides an output buffer providing multiple voltages comprising:

an arrangement of bootstrapping capacitors, and;

a charge replenishing mechanism that provides continuous pulses to the arrangement of bootstrapping capacitors, thereby maintaining voltage on said bootstrapping capacitors.

According to one embodiment of the invention, a compensating element is used to improve the rise time of output signal for capacitive loads.

According to one embodiment of the invention, at least some of the bootstrapping capacitors are parasitic capacitances.

According to one embodiment of the invention, the charge replenishing mechanism is a ring oscillator.

The present invention further provides a method for providing multiple voltages comprising:

bootstrapping the intermediate and output nodes using bootstrapping capacitor and;

replenishing the charge on the bootstrapping capacitor at periodic intervals so as to maintain said bootstrap voltage.

According to one embodiment of the invention, the bootstrapping is used to improve the rise time of the output signal for capacitive loads.

According to one embodiment of the invention, at least some of said bootstrapping capacitors are parasitic capacitances.

According to one embodiment of the invention, replenish of charge is implemented using a ring oscillator.

BRIEF DESCRIPTION OF THE DRAWINGS

The invention will now be explained with reference to the accompanying drawings.

DETAILED DESCRIPTION

Figure 1:
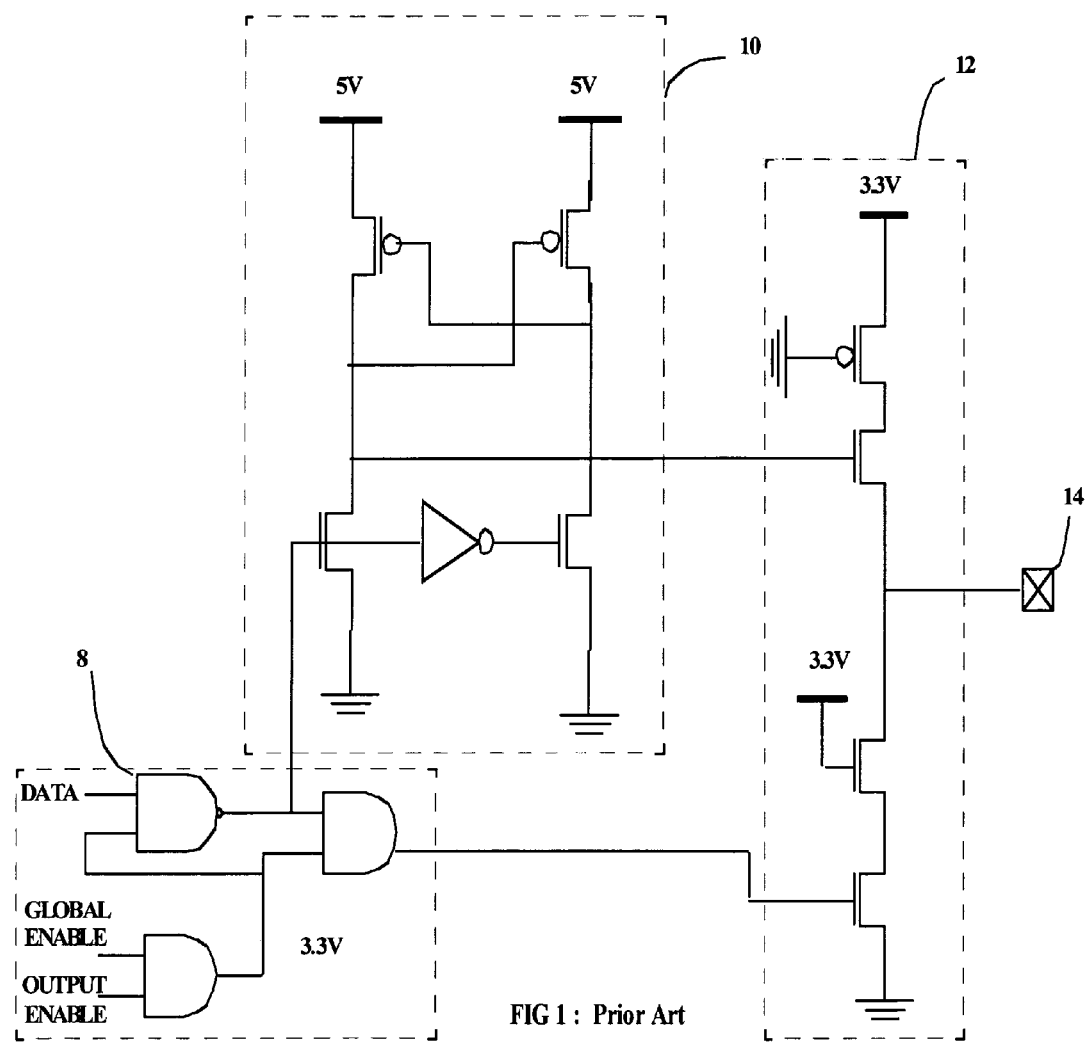
FIG. 1 illustrates a prior art output buffer implemented using a level shifter.
Figure 2:
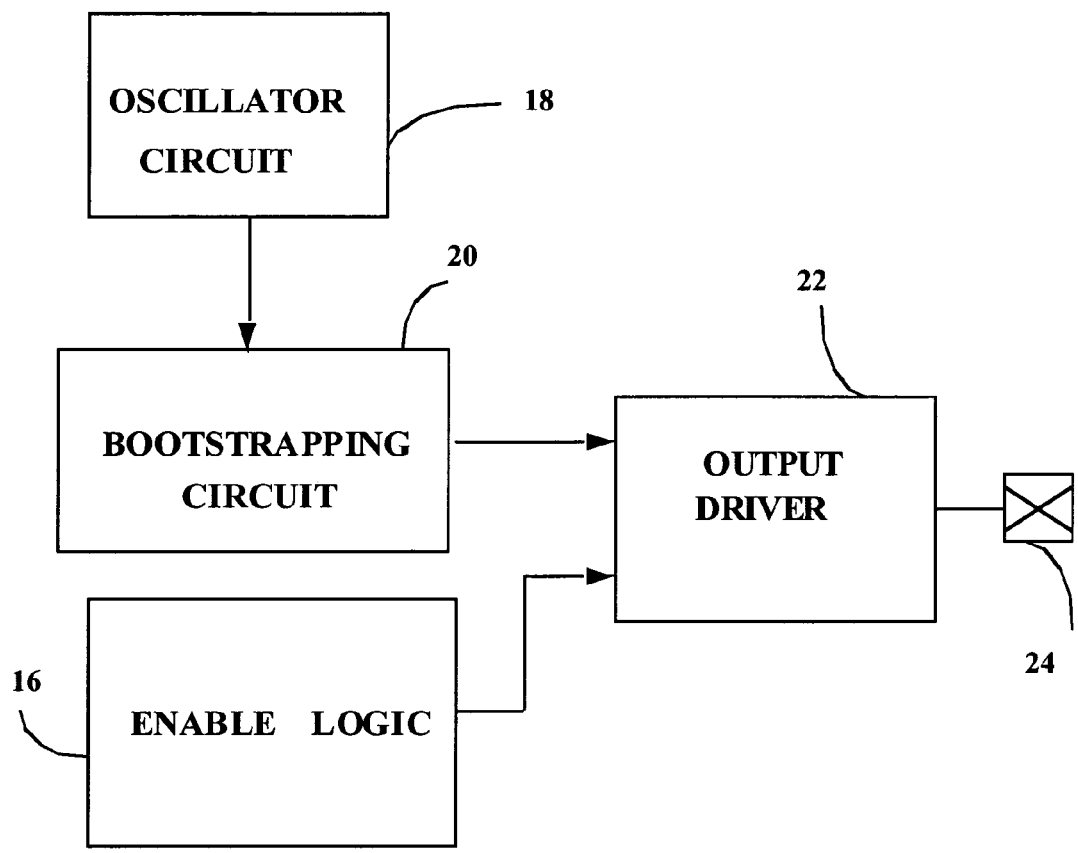
FIG. 2 is a block diagram of the present invention.

FIG. 2 illustrates a block diagram of the present invention. It contains an oscillator circuit 18 to provide continuous pulses to bootstrapping circuit 20. It also contains a logic enable circuit 16, which is used to drive the totem pole circuit 22.

Figure 3:
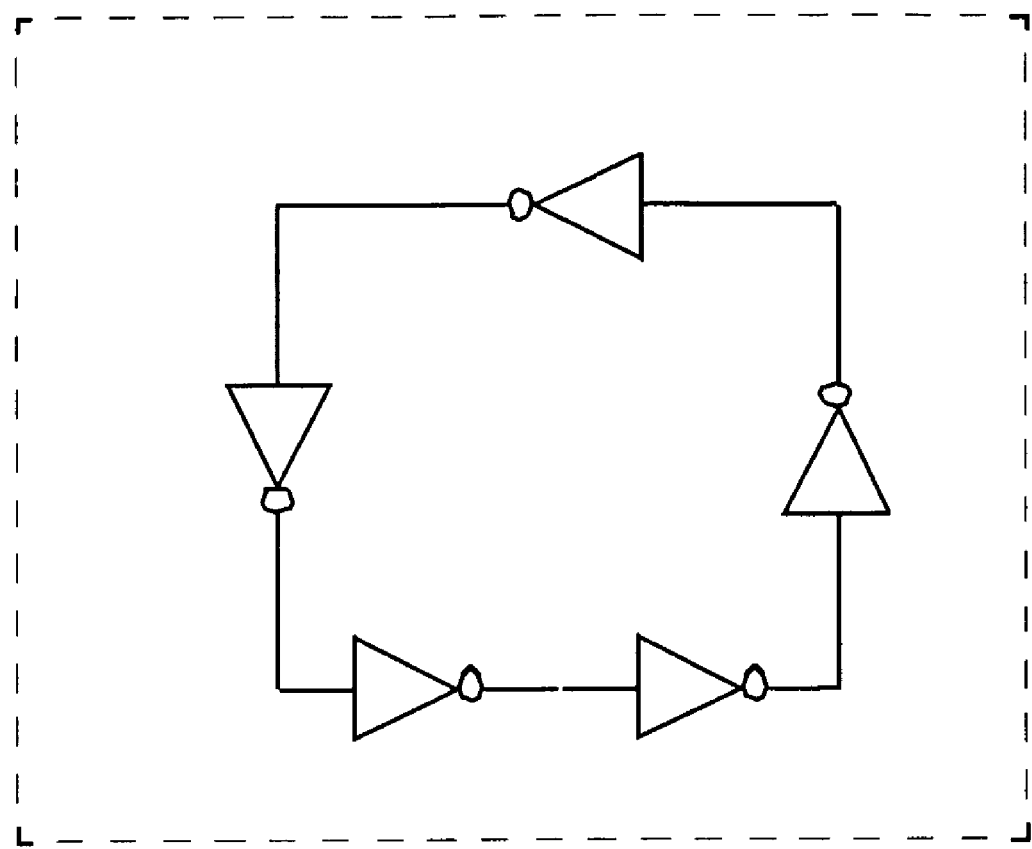
FIG. 3 is a ring oscillator used for sustaining bootstrapping at the gate of the output buffer.

FIG. 3 illustrates a ring oscillator. It includes 5 inverters connected in a ring. The temperature and process variation don't affect the performance of the output buffer and the frequency of the oscillator is also immaterial as long as the bootstrap voltage does not go below a minimum level required for threshold drop compensation. Frequency of the oscillator is decided by the gain of the inverters (i.e. sizes of the inverters) and the number of stages. A minimum number of inverter stages are required to sustain oscillation. In the present invention, the number of stages is 5. The bootstrap voltage achieved should not exceed a certain level so that the circuit remains high-voltage tolerant.

Figure 4:
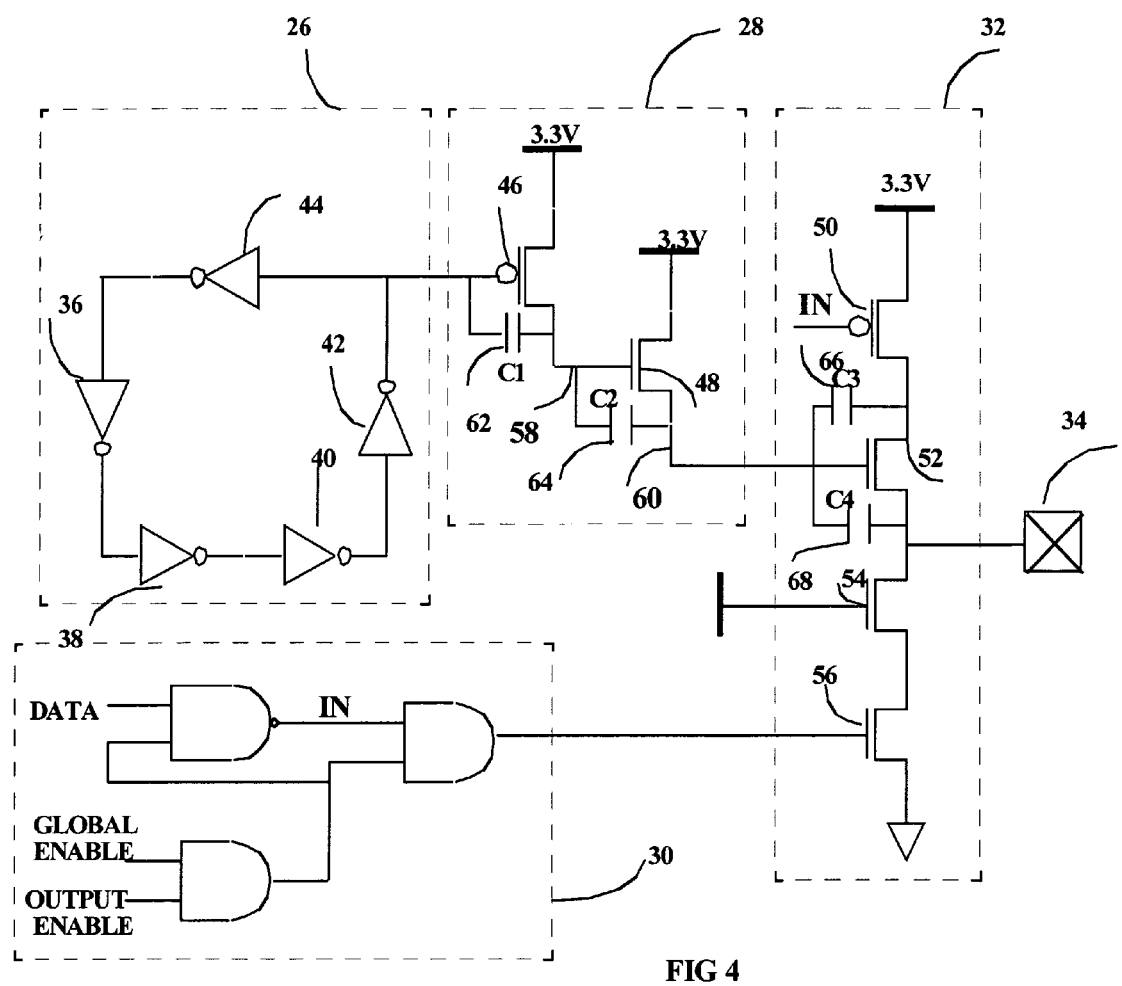
FIG. 4 illustrates the output buffer according to the present invention.

FIG. 4 is a schematic diagram of the output buffer of the invention. According to the present invention, pad 34 is pulled up by a p-channel device 50 in conjunction with bootstrapped N-channel device 52 and the pad is pulled low by permanently-on N-channel device 54 in series with N-channel device 56. Bootstrapping circuit 28 contains a P-channel device and an N-channel device to get the bootstrap voltage at the gate of the transistor 52. The transistor 54 is added to the totem pole output to make the circuit high-voltage tolerant.

Referring to the bootstrapping circuit 28, nodes 58 and 60 are the nodes that get bootstrapped by miller capacitances 62, 64, 66 and 68. There is a cumulative bootstrapping at node 60 which helps achieve a voltage exceeding 5V which would otherwise have been achieving a voltage close to 3.6 V, had the N-channel device 48 been removed from the circuit. Oscillator 26 helps sustain higher voltage at the gate of N-channel device 52 by providing pulses at regular intervals to provide transition at the gate of P-channel device 46. The gate of the N-channel device 52 will no longer remain at higher voltage when the pad 34 is driven low. This will keep the output buffer 5V tolerant. Oxide of the N-channel devices 52 and 48 are rated for higher voltage. It can also be observed that whenever data changes from low to high, it enhances the bootstrapped voltage.

Referring to the enable logic block 30, whenever global enable and output enable signals are raised high, data is passed onto the P-channel device 50 and the N-channel device 56. When data is low, transistor 50 is ON and pad 34 is pulled high. Similarly, whenever data is high, transistor 56 is ON and the pad 34 is pulled low. The output buffer gets restarted whenever a low signal comes at either of a global enable or output enable signal.

Referring to the pad driver totem pole block 32, it contains a P-channel device 50, a N-channel device 52, a N-channel device 54 and a N-channel device 56. Data is provided at the gate of 50 and 56. Whenever data goes high, transistor 50 passes 3.3 V, which, in turn, is passed onto the pad 34 by virtue of the bootstrapped voltage at the gate of transistor 52. Similarly, whenever data goes low, pad 34 is driven low through transistors 54 and 56.

If pad 34 is driven at 5V by some other logic, node 62 gets a voltage that is one threshold voltage (Vt) less than 3.3 V. At this voltage, transistor 50 does not turn on and pad 34 remains at 5V i.e. there is no power dissipation. Similarly, to make circuit 5 V tolerant, the output buffer needs to be restated, whenever the pad is driven at 5V by some other logic. In this case, drain to source voltage, gate to source and gate to drain voltage of transistors 50, 52, 54 and 56 do not exceed the tolerant voltage level. The oxide of the transistors 48 and 52 is rated for higher voltage. Transistors 46, 48 and 52 are required to have LDD structure. The clock signal can be applied at the gate of the transistor 46 instead of the oscillator circuit. As clock signals are available in I/O circuit for I/O registers, they can easily be routing at the desired place and hence can replace the oscillator circuit. If the bootstrapped buffer is used to drive a dynamic signal like clock, the oscillator circuit is not needed.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An output buffer providing multiple voltages comprising:
    an arrangement of bootstrapping capacitors;
    a charge replenishing mechanism which provides continuous pulses to said arrangement of bootstrapping capacitors to maintain voltage on said bootstrapping capacitors;
    a compensating element coupled to said charge replenishing mechanism to improve a rise time of an output signal for capacitive loads; and
    an element providing high-voltage tolerance to the output buffer.

2. The output buffer as claimed in claim 1 wherein at least some of said bootstrapping capacitors are parasitic capacitances.

3. The output buffer as claimed in claim 1 wherein said charge replenishing mechanism is a ring oscillator.

4. The output buffer as claimed in claim 1 wherein said compensating element is a transistor.

5. The output buffer as claimed in claim 4 wherein said transistor is a P-type transistor.

6. The output buffer as claimed in claim 1 wherein said element providing high-voltage tolerance to the output buffer is a transistor.

7. The output buffer as claimed in claim 6 wherein said transistor is an N-type transistor.

8. The output buffer as claimed in claim 7 wherein said N-type transistor is permanently on.

9. A method for providing multiple voltages comprising the steps of:
    bootstrapping the intermediate and output nodes using bootstrapping capacitor, and;
    replenishing the charge on said bootstrapping capacitor at periodic intervals so as to maintain said bootstrap voltage, wherein replenishing the charge includes using a compensating element to improve a rise time of an output signal for capacitive loads; and
    using an element providing high-voltage tolerance.

10. The method as claimed in claim 9 wherein at least some of said bootstrapping capacitors are parasitic capacitances.

11. The method as claimed in claim 9 wherein said replenish of charge is implemented using a ring oscillator.

12. The method as claimed in claim 9 wherein said compensating element is a transistor.

13. The method as claimed in claim 12 wherein said transistor is a P-type transistor.

14. The method as claimed in claim 9 wherein said element providing high-voltage tolerance is a transistor.

15. The method as claimed in claim 14 wherein said transistor is an N-type transistor.

16. The method as claimed in claim 15 wherein said N-type transistor is permanently on.

\* \* \* \* \*